United States Patent
Hsu

(10) Patent No.: US 9,971,111 B1
(45) Date of Patent: May 15, 2018

(54) ALIGNMENT MECHANISM OF OPTICAL INTERCONNECT STRUCTURE

(71) Applicant: INTERNATIONAL BUSINESS MACHINES CORPORATION, Armonk, NY (US)

(72) Inventor: Hsiang Han Hsu, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/804,260

(22) Filed: Nov. 6, 2017

Related U.S. Application Data

(63) Continuation of application No. 15/400,160, filed on Jan. 6, 2017.

(51) Int. Cl.
| | |
|---|---|
| *G02B 6/30* | (2006.01) |
| *G02B 6/32* | (2006.01) |
| *G02B 6/42* | (2006.01) |
| *G02B 6/12* | (2006.01) |
| *H05K 1/02* | (2006.01) |

(52) U.S. Cl.
CPC ............ *G02B 6/4227* (2013.01); *G02B 6/30* (2013.01); *G02B 6/4204* (2013.01); *G02B 6/4206* (2013.01); *G02B 6/4214* (2013.01); *G02B 6/4221* (2013.01); *G02B 6/4225* (2013.01); *G02B 6/4246* (2013.01); *H05K 1/0274* (2013.01)

(58) Field of Classification Search
CPC .. G02B 6/4227; G02B 6/4204; G02B 6/4206; G02B 6/4214; G02B 6/4221; G02B 6/4225; H05K 1/0274

USPC ............... 385/14, 31–33, 49–52, 88–92, 131
See application file for complete search history.

(56) References Cited

U.S. PATENT DOCUMENTS

| | | |
|---|---|---|
| 8,882,362 B2 | 11/2014 | Shiraishi |
| 9,011,020 B2 | 4/2015 | Ty Tan et al. |
| 2008/0181561 A1* | 7/2008 | Furuyama ............ G02B 6/4221 385/52 |

(Continued)

FOREIGN PATENT DOCUMENTS

| | | |
|---|---|---|
| JP | 2015184667 A | 10/2015 |
| WO | 2013/048730 A1 | 4/2013 |

OTHER PUBLICATIONS

Chou et al., "Design and Demonstration of Micro-mirrors and Lenses for Low Loss and Low Cost Single-Mode Fiber Coupling in 3D Glass Photonic Interposers", Electronic Components and Technology Conference, 2016 IEEE 66th. May 31-Jun. 3, 2016. pp. 1-7.

(Continued)

*Primary Examiner* — Akm Enayet Ullah
*Assistant Examiner* — Michael Mooney
(74) *Attorney, Agent, or Firm* — Tutunjian & Bitetto, P.C.; Vazken Alexanian

(57) ABSTRACT

An optical interconnect structure includes a lens array and a waveguide substrate. The lens array has a dummy lens. The waveguide substrate has a dummy core, a dummy mirror corresponding to the dummy core, and an inspection opening for injecting inspection light into the dummy core to reach the dummy mirror. In the optical interconnect structure, the lens array is mounted on the waveguide substrate such that the dummy lens of the lens array is positioned on the dummy mirror by monitoring inspection light from the inspection opening.

12 Claims, 11 Drawing Sheets

(56) References Cited

U.S. PATENT DOCUMENTS

2015/0277066 A1* 10/2015 Nakagawa ........... G02B 3/0006
385/33

OTHER PUBLICATIONS

List of IBM Patents or Patent Applications Treated as Related dated Nov. 6, 2017, 2 pages.

* cited by examiner

FIG. 2A
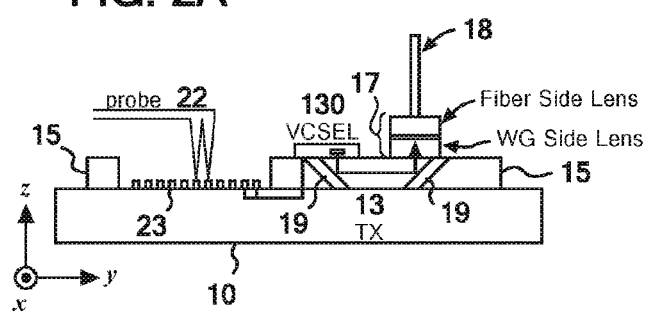
FIG. 2B
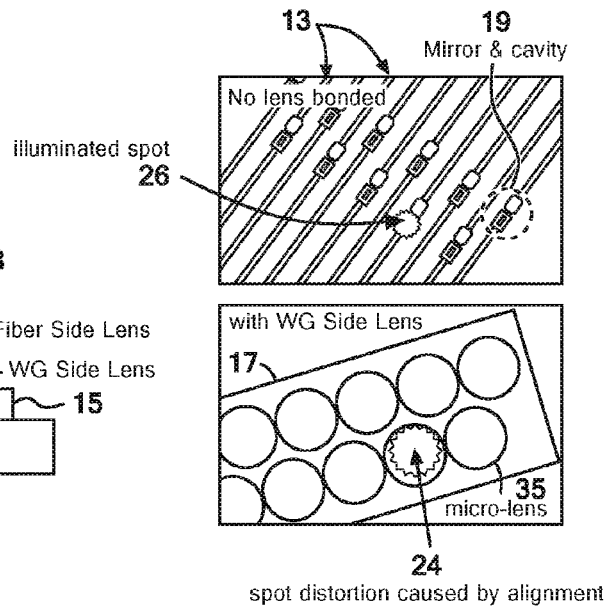
FIG. 2C
FIG. 2D
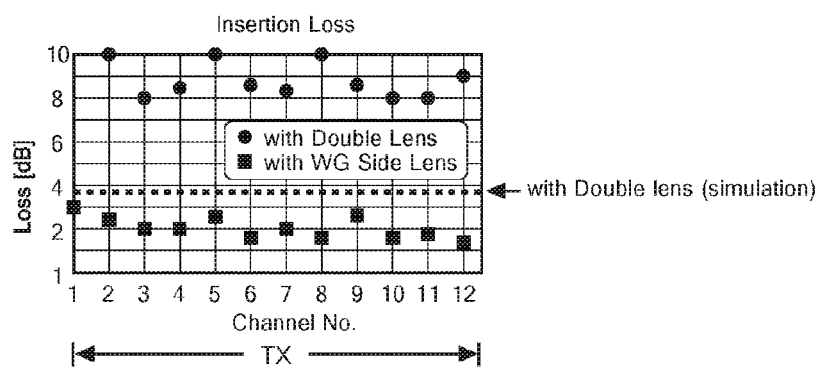

before lens assembly during lens assembly

FIG. 9A
FIG. 9B
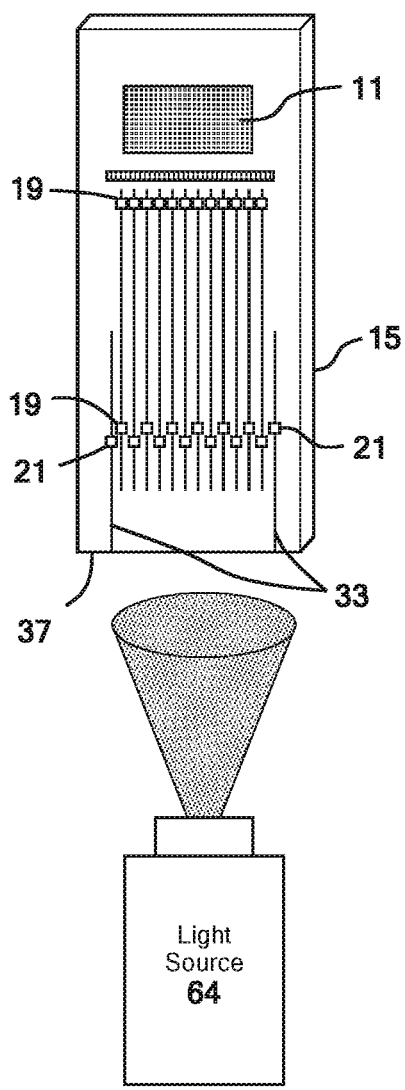
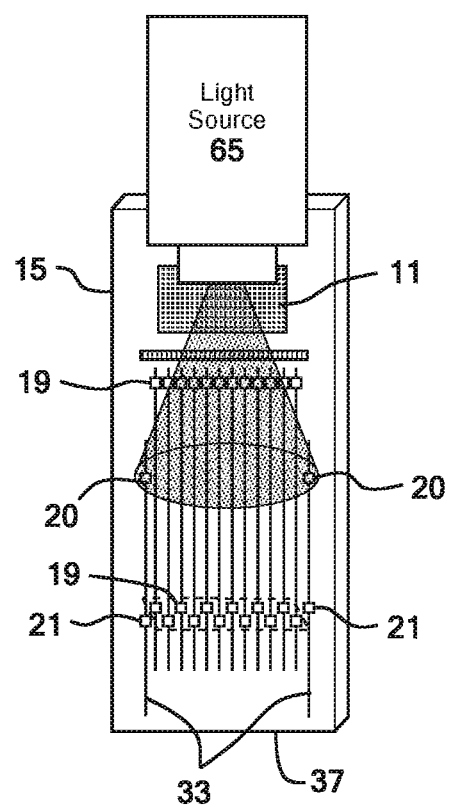

ALIGNMENT MECHANISM OF OPTICAL INTERCONNECT STRUCTURE

BACKGROUND

Technical Field

The present invention generally relates to an optical interconnect structure with a fine alignment of micro-lens assembly and a manufacturing method of the same. Specifically, the present invention provides an alignment mechanism for bonding a micro-lens connector on a polymer waveguide substrate.

Related Art

Recently, a fine alignment mechanism is needed for optical coupling of an optical interconnect structure, or an optical module chip module (Optical MCM).

With current a micro-lens connector assembly on a waveguide substrate, existing alignment markers are designed for manual assembly of an optical interconnect structure including a micro-lens assembly. However, the protruding structures of the alignment markers may cause reliability issues during mass production processes as well as low contrast when viewed by an automatic camera inspection system.

SUMMARY

According to an embodiment of the present invention, a method for manufacturing an optical interconnect structure is provided. The method includes providing a lens array having at least one dummy lens. The method further includes providing a waveguide substrate having at least one dummy core, at least one dummy mirror corresponding to each dummy core, and at least one inspection opening for injecting inspection light into the dummy core to reach the dummy mirror. The method further includes fixing the lens array on the waveguide substrate, including aligning the dummy lens with the dummy mirror by monitoring inspection light from the inspection opening.

According to another embodiment of the present invention. an optical interconnect structure is provided. The optical interconnect structure includes a lens array having at least one dummy lens. The optical interconnect structure further includes a waveguide substrate having at least one dummy core, at least one dummy mirror corresponding to each dummy core, and at least one inspection opening for injecting inspection light into the dummy core to reach the dummy mirror. Further, in the optical interconnect structure, the lens array is fixed on the waveguide substrate so as to align the dummy lens with the dummy mirror by monitoring inspection light from the inspection opening.

According to another embodiment of the present invention, an optical interconnect structure is provided. The optical interconnect structure includes a first optical member having at least one dummy lens. The optical interconnect structure further includes a second optical member having at least one dummy core, at least one dummy mirror corresponding to each dummy core, and at least one inspection opening for injecting inspection light into the dummy core to reach the dummy mirror. Further, in the optical interconnect structure, the first optical member is fixed on the second optical member so as to align the dummy lens with the dummy mirror by monitoring inspection light from the inspection opening.

BRIEF DESCRIPTION OF THE DRAWINGS

FIG. 2A depicts an example of Insertion Loss for a single Optical module chip module (MCM);

FIG. 2B depicts pairs of mirror and cavity arrays corresponding to a waveguide core array within a waveguide substrate without a bonded micro-lens connector;

FIG. 2C depicts an example of an image of a focus spot loss caused by misalignment with a waveguide side lens;

FIG. 2D depicts an example of a graph of insertion loss caused by misalignment between the waveguide side lens and a fiber side lens;

FIG. 9A depicts an example of the waveguide substrate structure with dummy cores for alignment mechanisms according to an alternative embodiment of the present invention;

FIG. 9B depicts an example of the waveguide substrate structure with dummy cores for alignment mechanisms according to an alternative embodiment of the present invention;

DETAILED DESCRIPTION

Hereinafter, exemplary embodiments of the present invention will be described in detail with reference to the attached drawings.

It should be noted that the present invention is not limited to these exemplary embodiments to be given below and may be implemented with various modifications within the scope of the present invention. In addition, the drawings used herein are for purposes of illustration, and may not show actual dimensions.

Recently, improvement to mass production yield of micro-lens (single lens or double lens) connector assembly processes for polymer waveguide embedded substrate has been needed. In the waveguide embedded substrate, a pair of waveguide side and fiber side of a micro-lens connector is used to couple the light from the waveguide substrate to the fiber, or from the fiber to the waveguide substrate. The coupling efficiency between both of the sides of the connector dominates the total insertion loss for an optical link. In view of this, the exemplary embodiments described herein provide implementations of dummy cores, dummy lenses, and dummy mirrors for mass production of an Optical MCM.

Figure 1A:
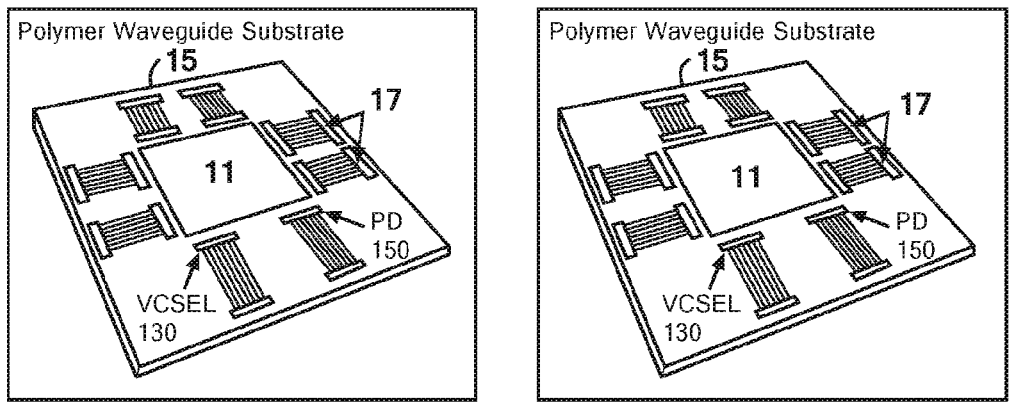
FIG. 1A depicts an example of a hardware configuration of an optical communication system according to an exemplary embodiment of the present invention.
Figure 1B:
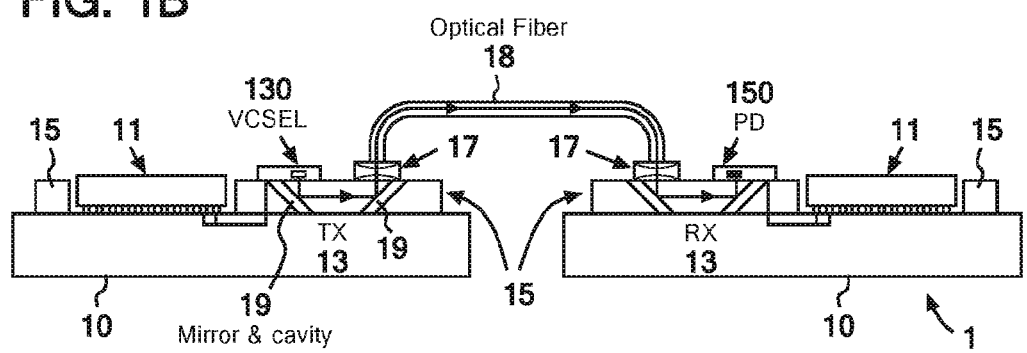
FIG. 1B depicts an example of a hardware configuration of an optical communication system according to an exemplary embodiment of the present invention.
Figure 1C:
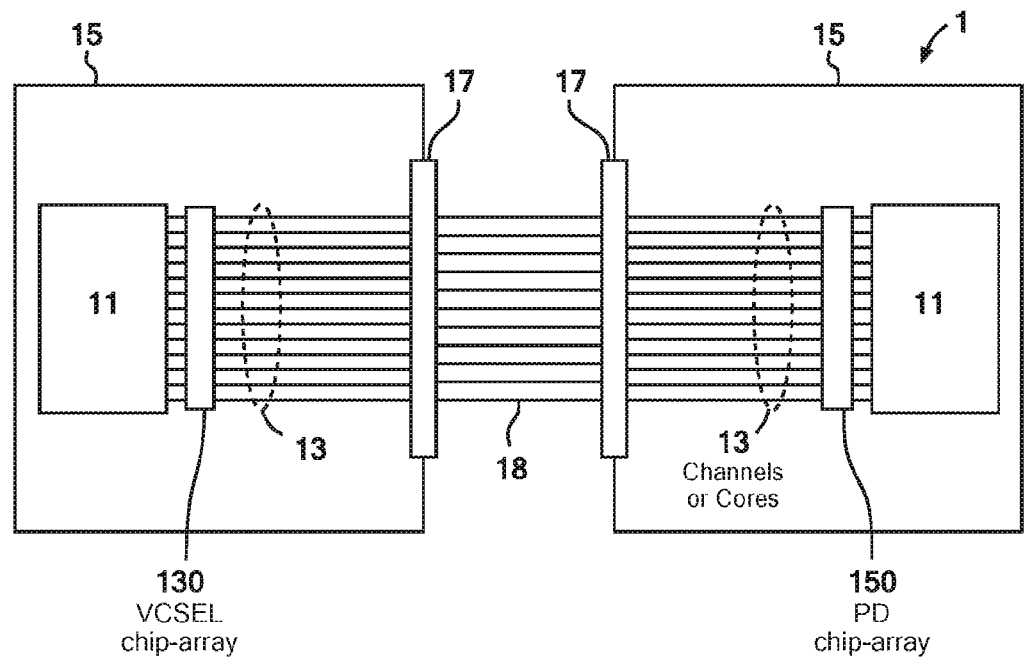
FIG. 1C depicts an example of a hardware configuration of an optical communication system according to an exemplary embodiment of the present invention.

Referring to FIGS. 1A, 1B, and 1C, examples of a hardware configuration of an optical communication system according to an exemplary embodiment of the present invention are shown. As shown in the figures, the optical communication system 1 may include at least two polymer waveguide embedded substrates. Each polymer waveguide embedded substrate may include an optical multi-chip modules (Optical MCMs) 15 mounted on an organic substrate 10. An optical transparent waveguide embedded substrate 15 may incorporate a micro-lens connector 17, an Integrated Circuit (IC) 11, a vertical cavity surface emitting laser (VCSEL) 130, and a photo detector (PD) 150 to form the OMCM 15. The IC 11 may be a computer processing unit (CPU) or switch.

Referring to FIG. 1A, a perspective view of a hardware configuration of an Optical MCM is shown according to an exemplary embodiment. As shown in the figure, in the Optical MCM, at least two CPUs 11 may connect, via VCSELs 130 and PDs 150, with four waveguide core arrays 13 including four transmitter (TX) core arrays and four receiver (RX) core arrays.

As shown in FIG. 1B, a side view of the optical communication system 1 is shown. Optical MCMs 15 are connected together to form an optical communication system 1 with an optical link 13 of TX (transmitter) to RX (receiver) via an optical fiber 18 (e.g., a Graded Index Multi-Mode Fiber (GI-MMF)). VCSEL 130, PD 150, and TX/RX links (e.g., channel cores) 13 are included in the Polymer waveguides 15. The fiber cable 18 may include GI-MMF, which has twelve channels.

On a left side of the figure, the Optical MCM 15 is illustrated as a TX channel 13. On the right side of the figure, the Optical MCM 15 is illustrated as a RX channel 13. On the left side, VCSEL 130 converts a CPU-generated electrical signal to an optical signal (e.g., light) to transfer it down in vertical direction at a mirror 19. The light is reflected on the mirror 19 to propagate through the TX channel core 13. The light is reflected with another mirror 19 to propagate through the left side micro-lens connector 17. Then the light propagates through the optical fiber 18 to reach the micro-lens connector 17 of the right Optical MCM 15. On the right side of the figure, the optical signal passes through the micro-lens connector 17 and is reflected by the left mirror 19 of the right Optical MCM 15. Then the light propagates through the RX channel core 13 to reach the PD 150. The PD 150 coverts the light to an electrical data signal, which can be processed by the IC 11.

Referring to FIG. 1C, a top view of a hardware configuration of the optical communication system 1 is shown. As shown in the figure, the optical communication system 1 includes two Optical MCMs 15. Each Optical MCM 15 may include an IC 11, VCSEL chip array 130, PD chip array 150, waveguide core array 15, and the micro-lens connector 17.

The Optical MCM 15 may include twelve waveguide cores 13 of which each waveguide core corresponds to one of twelve cables of the optical fiber 18. In a transmitter side (TX 13), each of the VCSEL chip arrays 130 may include twelve VCSEL devices of which each corresponds to one of twelve waveguide cores 13. In a receiver side (RX 13), the Optical MCM 15 may include twelve waveguide cores of which each corresponds to one of twelve fiber cables. PD chip array 150 may include twelve PD devices of which each corresponds to one of the waveguide cores. In such configurations of two Optical MCMs 15, micro-mirrors 19 are used such that optical signals (e.g., lights) from the VCSEL chip array 130 go into the polymer waveguide cores 13 and the lights from the polymer waveguides reach the PD chip array 150. Thus, the alignment of the micro-mirrors 19 should be precise.

Referring to FIG. 2A, FIG. 2B, FIG. 2C, and FIG. 2D, insertion loss for a single Optical MCM is shown. As shown in FIG. 2A, a polymer waveguide substrate 15 is incorporated with a micro-lens connector 17 to form a waveguide embedded substrate, or an optical interconnect structure (Optical MCM). Also the waveguide embedded substrate 15 is mounted on the organic substrate 10. There are several electric pads 23 on which to mount CPU 11.

Referring to FIG. 2B, a plurality of mirror and cavity arrays 19 corresponding to the waveguide core array 13 within the waveguide substrate without a micro-lens connector bonded are shown. As shown in the figure, waveguide side micro-lens connector 17 is not mounted on the mirror array 19 of the waveguide substrate 15. In an experimental trial, electric signals can be injected into electric pads 23 by contacting probes 22 to electrically activate a specific VCSEL 130. The VCSEL 130 emits laser light to a specific TX core 13. An illuminated spot 26 by laser light can be observed through a specific mirror 19 corresponding to the TX core 13.

Referring to FIG. 2C, an image of a misaligned spot caused by misalignment between the turning mirror 19 and the waveguide side lens is shown. As shown in the figure, waveguide side micro-lens connector 17 is mounted above the mirror array 19 of the waveguide substrate 15. Spot distortion 24 caused by misalignment can be observed through a specific mirror 19 corresponding to the TX core 13.

Referring to FIG. 2D, a graph illustrating insertion loss caused by misalignment between the waveguide side lens and fiber side lens of the connector for the Optical MCM is shown. In the figure, the graph depicts insertion losses of the waveguide side lens and double lens misalignments. In an experimental trial, the insertion loss with waveguide side lens is shown as square dots. In theoretical simulation, it is expected that the insertion loss with double lens could be suppressed at a particular level represented by a dotted-line in the figure. However, in an experimental trial, as shown by the circle dots, the insertion loss increases dramatically when fiber side connector 17 is connected with the waveguide side lens. The insertion loss of misalignment with the waveguide side lens does not dominate the total loss caused with misalignment of a micro-lens connector. In view of the optical fiber 18, the low coupling efficient to the fiber side lens is a major factor in the total loss caused by misalignment between turning mirror 19 and waveguide side connector 17. The micro-lens connector 17 is composed of tightly combined pair of waveguide side and fiber side micro-lenses. Even if the waveguide side lens of the connector 17 ensures to somewhat finely position the waveguide side lens 17 onto waveguide substrate 15, the insertion loss of the double lens 17 is drastically enhanced. During mass-production of Optical MCMs, it is critical that alignment of the micro-lens connector on a polymer waveguide integrated substrate is improved. Therefore, the waveguide side lens 17 should be more finely and easily positioned above the mirror array 19 for mass production of Optical MCMs.

Figure 3:
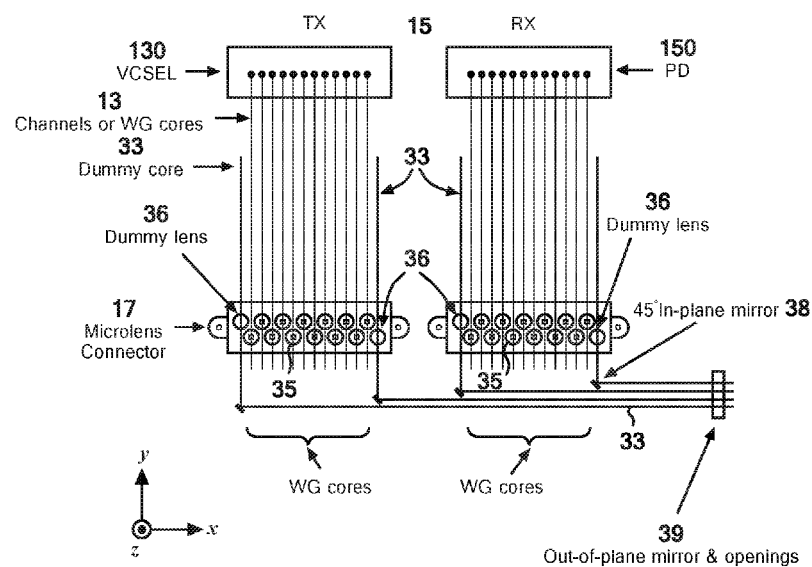
FIG. 3 depicts an example of an alignment mechanism with dummy cores according to an exemplary embodiment.

Referring to FIG. 3, an example of an alignment mechanism with dummy cores is illustrated according to an exemplary embodiment. As shown in the figure, the micro-lens connector 17 is mounted on the waveguide substrate 15. The connector 17 is adjustably moved to fix onto the above mirror array 19 of the waveguide substrate 15. Alignment mechanisms with dummy cores 33 is implemented with the waveguide substrate 15 so as to work not only for the TX side, but also for the RX side. As dummy cores, additional cores 33 are patterned to align with twelve regular waveguide cores 13 in the waveguide substrate 15 for positioning instead of actual signal transfer. Using a 45° in-plane mirror 38, the dummy cores 33 may be extendable to openings, which are provided together with a 45° out-of-plane mirror 39. Inspection light can be injected into the dummy cores 33 from the openings of the out-of-plane mirror 39. The openings of the 45° out-of-plane mirror 39 enable to inject inspection light into dummy cores 33 from above the waveguide substrate 15.

The existing waveguide side micro-lens connector 17 is also modified to add additional lens 36 to regular lens 35 corresponding to each regular channel waveguide 13 for signal transfer. Additional lens 36 corresponds to each dummy core 33. Additional lens 36 may be implemented to align with twelve regular micro-lenses 35 in the micro-lens connector 17. In addition, dummy lenses 36 correspond to the dummy cores 33. The dummy lenses 36 are used for alignment above the dummy mirrors 21 with reverse direction against regular mirror 19. As shown in the figure, the dummy cores 33 are not required to reach VCSEL chip 130 and PD chip 150. The dummy cores 33 are turned at the 45° in-plane mirrors 38 toward the 45° out-of-plane mirror 39. Additional laser light for inspection is injected into openings of the 45° out-of-plane mirror 39 outside the waveguide substrate 15.

Figure 4:
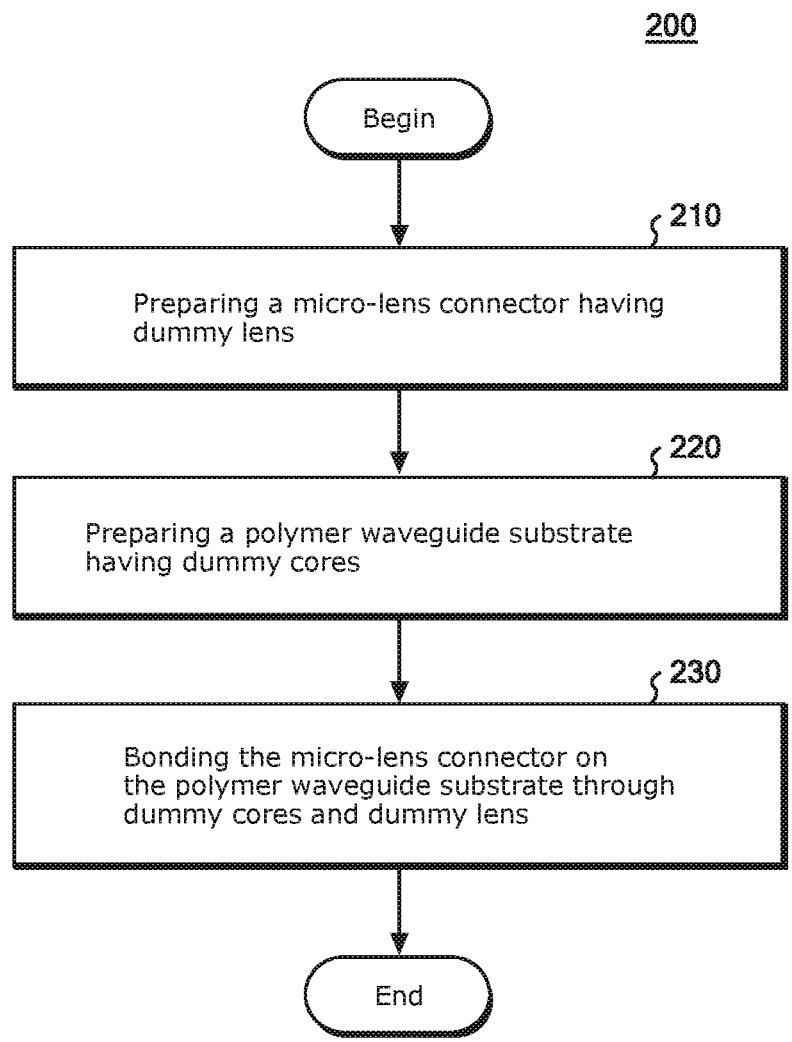
FIG. 4 depicts a flowchart of an alignment process for bonding a micro-lens connector on a polymer waveguide substrate according to an exemplary embodiment.

Referring to FIG. 4, a flowchart representing an alignment process for bonding a micro-lens connector on a polymer waveguide substrate is shown according to an exemplary embodiment. As shown in the figure, the flowchart of the alignment process may include three steps as follows: a preparation step 210 of the micro-lens connector, a preparation step 220 of the waveguide substrate, and a bonding step 230 of the micro-lens connector onto the waveguide substrate during injecting the inspection light through dummy cores and dummy lens. In some embodiments, the bonding step 230 may include a mounting step and/or a fixing step.

An alignment process of the invention includes step 210 of preparing a micro-lens connector 17 having one or more dummy lens 36 aligned with each of micro-lenses 35 corresponding to each the optical cores 13. The process includes step 220 of preparing a polymer waveguide substrate having one or more dummy cores 33 and one or more dummy mirrors for alignment. The dummy mirror is used for turning the direction of the dummy cores 33, for example, to a vertical direction.

Finally, an inspection light for alignment may be injected through additional openings explained hereinafter. The light is dedicated to the invention and is different from the VCSEL 130 emitted light for signal transfer. During the bonding step 230, the fixing step is conducted while monitoring the injected light spots through dummy cores 33 and dummy lens 36. The fixing step may include the mounting step. By fixing the connectors 17 on the waveguide substrate 15, the alignment process enables mass-production of the optical communication system 1 with high bandwidth and high quality.

The fixing step of the alignment process is detailed as the following steps. Before injecting the inspection light, the fixing step may include capturing an image of the lens array with an inspection camera to identify a centroid position of the dummy lens 36. Then the fixing step may include mounting the lens array on the waveguide substrate 15 by referring (e.g., referencing) to the previously captured image. Next, visible light can be injected into the dummy cores 33 through an inspection light to reach the dummy mirrors. The injected light illuminates the dummy mirrors to form illuminated spots on the dummy mirrors. The illuminated light spots can be observed through the dummy micro-lens 36 with an optical sensor, e.g., an inspection camera including a charge coupled device (CCD) and photo detector. The optical sensor detects the illuminated spots on the mirror through the dummy lens 36 to evaluate the characteristics (such as centroid, intensity, area, etc.) of the illuminated spots. At the same time, the micro-lens connector 17 can be adjustably moved on the waveguide substrate 15 to compensate the displacement of the micro-lens connector 17 from the above mirror array 19 of the waveguide substrate 15.

Figure 5A:
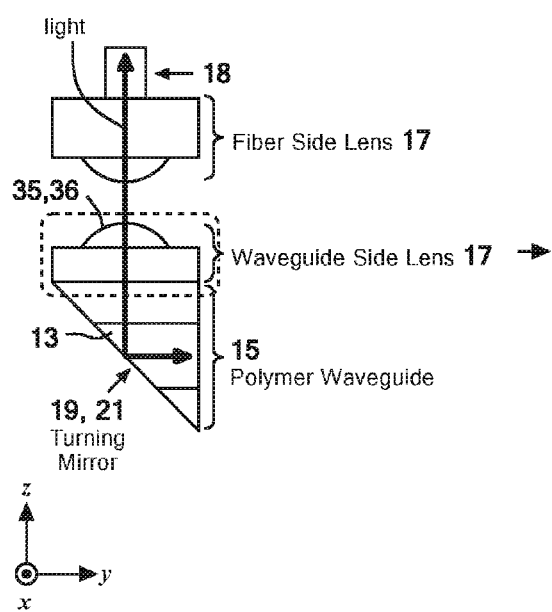
FIG. 5A depicts an example of a modification of a micro-lens connector according to an exemplary embodiment.
Figure 5B:
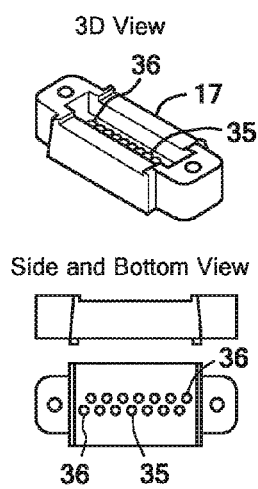
FIG. 5B depicts an example of a modification of a micro-lens connector according to an exemplary embodiment.

Referring to FIG. 5A and FIG. 5B, an example of a modification of an existing micro-lens connector 17 is shown according to an exemplary embodiment. As shown in FIG. 5A, the existing micro-lens connector 17 is separated into a waveguide side lens and a fiber side lens, which are finely combined with each other after assembling. The connector 17 is mounted on the polymer waveguide 15 such that the regular lens 35 and dummy lens 36 should be finely positioned above the regular mirror 19 and the dummy mirror 21. In the figures, as the dummy lens 36 can be used for inspection alignment, at least one additional micro-lens may be added in the waveguide side lens. The dimension of the connector may not be required to add any changes to the modification of an existing double micro-lens connector 17.

In FIG. 5B, a three dimensional (3D) view, side view, and bottom view of the modification of an existing micro-lens connector 17 is illustratively depicted. Twelve micro-lenses 35 may be aligned on the connector 17. Typically, the waveguide side and the fiber side of the lens connector 17 respectively may include twelve regular micro-lenses 35. The lens connector 17 may also include an additional two micro-lenses 36 for inspection. Additional two micro-lenses 36 may be located at both edges of the regular lenses 35. Each half of twelve micro-lenses 35 are aligned with the other half of twelve micro-lenses somewhat shifted alternatively. Dummy micro-lenses 36 may be located at the outermost right side and the outermost left side of the connector 17. The position and number of the dummy lenses 36 are not limited to the configuration and structure of the connector 17.

Figure 6A:
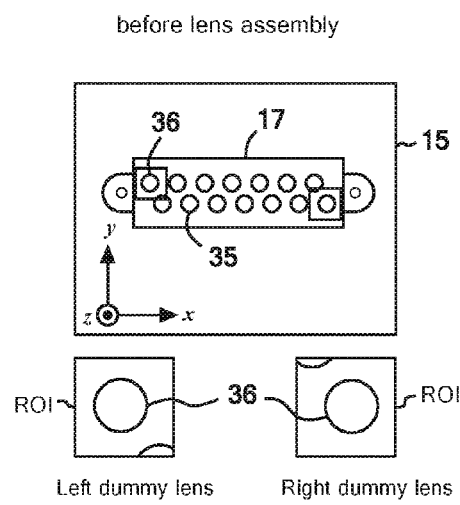
FIG. 6A depicts an example of an alignment process with camera views according to an exemplary embodiment.
Figure 6B:
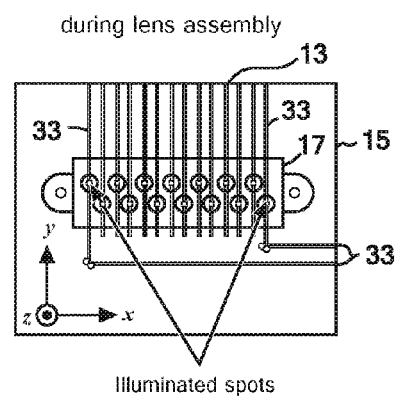
FIG. 6B depicts an example of an alignment process with camera views according to an exemplary embodiment.

Referring to FIG. 6A and FIG. 6B, an example of an alignment process with camera views is shown according to an exemplary embodiment. In FIG. 6A, inspection camera views show a top image of the Optical MCM before the connector assembly process to the waveguide substrate 15. In FIG. 6B, inspection camera views show a top image of the Optical MCM during the connector assembly process to the waveguide substrate 15. In FIG. 6A, left dummy lens 36 and right dummy lens 36 are identified by the region of interest (ROI) marked by the inspection camera. Marking procedures with the use of the camera view is given before assembling micro-lens connector 17 to polymer waveguide 15 as follows. First, the micro-lens connector 17 is placed under the inspection camera of an automatic camera inspection system. Next, the inspection camera focuses on the bottom surface of the micro-lens.

In FIG. 6B, positioning procedures with the use of the camera view is given during assembling the connector 17 to the waveguide substrate 15 as follows. The waveguide substrate 15 is illuminated with an external light source. Illuminated light can be observed through the dummy lens 36. Finally, the procedures of the automatic camera inspection system enable to finely and efficiently position the connector 17 above the regular mirrors 19 and the additional mirror 21 of the waveguide substrate 15. The alignment process for the micro-lens connector assembly is conducted in the backend of the entire Optical MCM production flow.

Though the external light source for illumination is not limited to visible light, the following two points should be considered. First, as visible light, the red light (e.g., 650 nm) is easier and cheaper to maintain fabrication machines for mass-production of Optical MCMs. Second, for the purpose of illumination, a visible light source can offer larger illumination area (e.g., ~1 mm).

Figure 7:
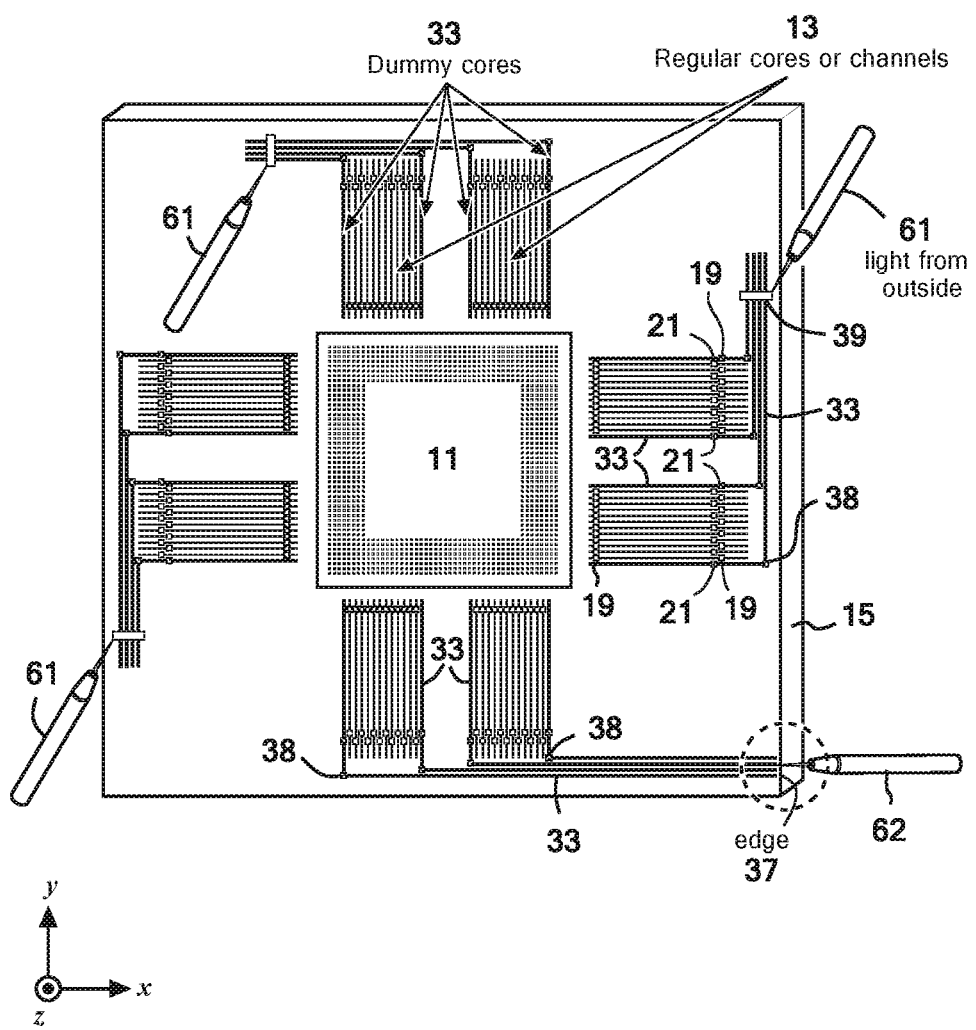
FIG. 7 depicts an example of a structure of the waveguide substrate before assembling the Optical MCM according to an alternative embodiment of the present invention.

Referring to FIG. 7, an example of a structure of the waveguide substrate before assembling the Optical MCM is shown according to an alternative embodiment of the present invention. As shown in the figure, a waveguide substrate 15 may include dummy cores 33, dummy mirrors 36, and extra mirrors & openings 38, 39, which are dedicated to the alignment mechanism. Out-of-plane turning mirrors 39 are for guiding light from outside into the substrate 15. In-plane turning mirrors 38 are for guiding light from outside to positioning turning mirror.

In an embodiment, visible light 61 may be injected in the dummy cores 33 through the openings of the 45° out-of-plane mirror 39 from outside of the waveguide substrate 15.

In another embodiment, if the dummy cores 33 go to the edge of the waveguide substrate 15, the 45° out-of-plane mirror 39 is not necessary within the waveguide substrate 15. The dummy cores 33 may turn at the 45° in-plane mirrors 38 to reach the edge of the waveguide substrate 15. The openings for injecting inspection light are also fabricated on the edge 37 of the waveguide substrate 15. Otherwise, the dummy cores 33 may directly extend to the edge 37 of the waveguide substrate 15 without adding any extra mirrors, e.g., the in-plane mirror 38 and the out-of-plane mirror 39. Visible light 62 may be injected in dummy cores 33 through the openings. Then, in the automatic camera inspection system, any illuminated spots at the dummy mirror 21 can be easily detected by the inspection camera of the automatic camera inspection system.

In the fabrication process of the waveguide substrate 15, by using photolithography and then removal of unwanted areas, regular cores for signal transfer and dummy cores can be patterned simultaneously. Moreover, the 45° turning mirror may be fabricated by a laser ablation process. Extra mirrors 38, 39 may have any degrees except for 45 degrees for variations of the alignment mechanisms. No additional processes are required for dummy cores 33 since they are patterned simultaneously with regular polymer waveguide cores 13. The alignment method disclosed herein enables sample testing and simplifies micro-lens connector bonding processes for mass production. Again, the alignment process for the micro-lens connector assembly is conducted in the backend of the entire Optical MCM production flow.

Figure 8:
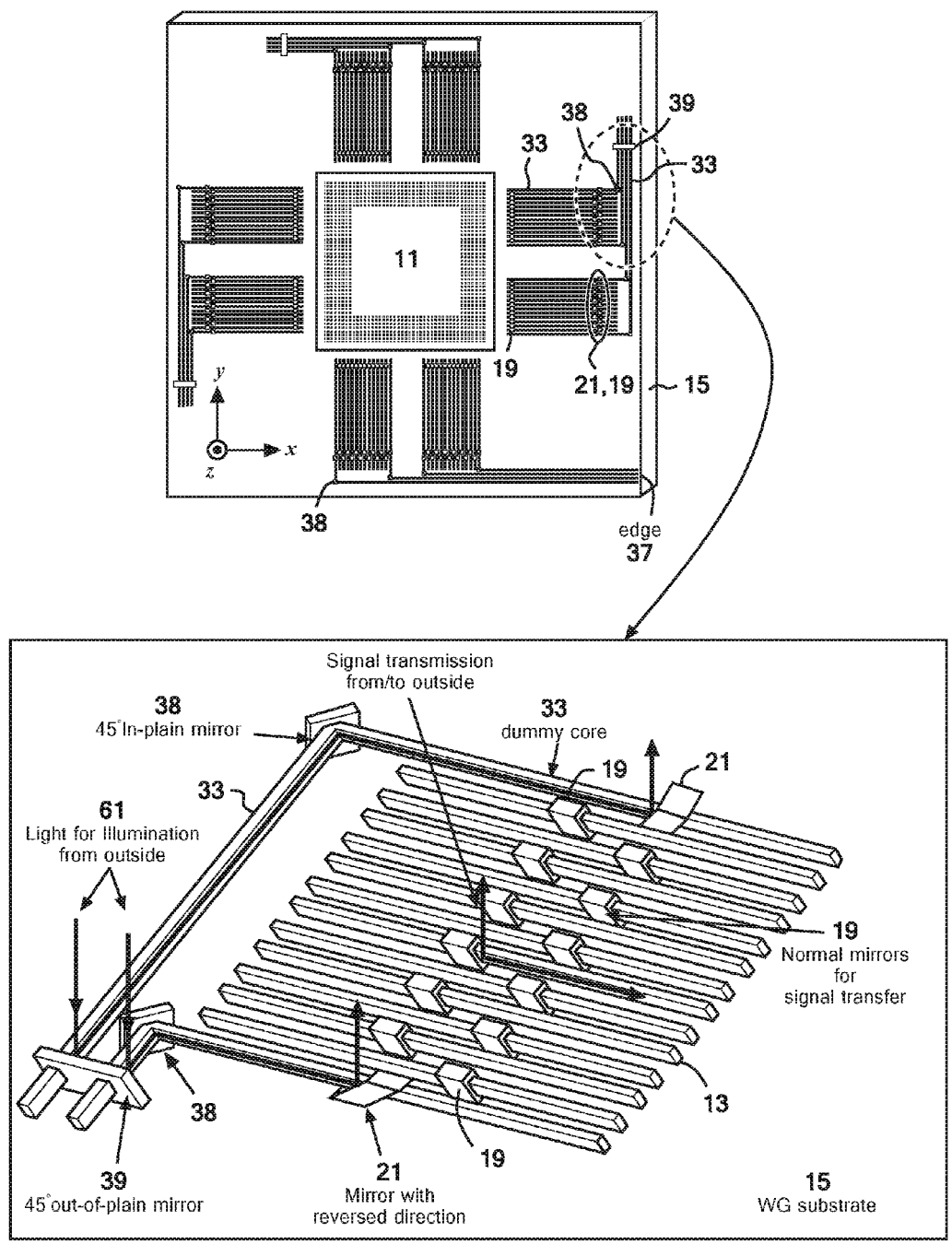
FIG. 8 is a perspective view of an inner Polymer waveguide substrate according to an exemplary embodiment.

Referring to FIG. 8, a perspective view of an inner waveguide substrate according to an alternative exemplary embodiment is shown. As shown in the figure, an inner structure view of the waveguide substrate 15 is implemented with dummy cores 33, dummy mirrors 21, and extra mirrors 38, 39. The dummy cores 33 are aligned with regular core 13. The dummy cores 33 are turned in a perpendicular direction at extra mirrors 38.

In an embodiment, dummy mirrors 21, with which the dummy cores 33 are connected, have a reverse direction to regular mirrors 19 for signal transfer. In addition, the dummy cores 33 may be turned at the 45° in-plane mirror 38, and then extend to one 45° out-of-plane mirror 39 or an edge of the waveguide 15. Dummy cores 33 are patterned to be aligned with regular waveguide cores 13 for alignment instead of signal transfer. The light for illumination of visible inspection is injected from a 45° out-of-plane mirror 39.

Referring to FIG. 9A and FIG. 9B, examples of the waveguide substrate structures with dummy cores for alignment mechanisms according to alternative exemplary embodiments of the present invention are shown. As shown in FIG. 9A, dummy cores 33 may extend to an edge 37 of the waveguide substrate 15 without bypassing extra mirrors 38, 39. Dummy mirrors 21 have a reverse direction against regular mirror 19. A light source 64 may directly illuminate the edge side 37 of the waveguide substrate 15. The light from light source 64 is injected through the openings on the edge 37.

As shown in FIG. 9B, dummy cores 33 may extend to additional mirrors 20, which are located close to the IC 11 on the waveguide substrate 15. Additional mirrors 20 are fabricated in the waveguide substrate 15 to reflect light toward the edge side 37 of the waveguide substrate 15. In an embodiment shown in the figure, additional mirrors 21 are aligned with the regular mirrors 19. The connector 17 is mounted above the regular mirror array 19 to match the dummy lens 36 with dummy mirrors 21 such that light source 65 can directly illuminate the openings 21 from the side of the CPU 11.

In an alternative alignment, the in-plane and out-of-plane mirrors 38, 39 are unnecessary for turning the dummy cores 33. Such embodiments enable easy employment of the alignment mechanism when fixing the micro-lens connector 17 onto the polymer waveguide substrate 15. Considering variation of the embodiments and the area of the Optical MCM, appropriate alignment mechanisms may be designed to become smaller or more compact.

The alignment process utilizes typical prototypes of the Optical MCM. Different types of applications are also considered as follows. In the embodiments shown in the figures, larger size light spots may be acceptable to openings for alignment, the openings of which are located on the edge 37 and on the surface on the waveguide substrate 15. The dimension of light source and lens attaching head should be carefully considered during production processes.

Figure 10:
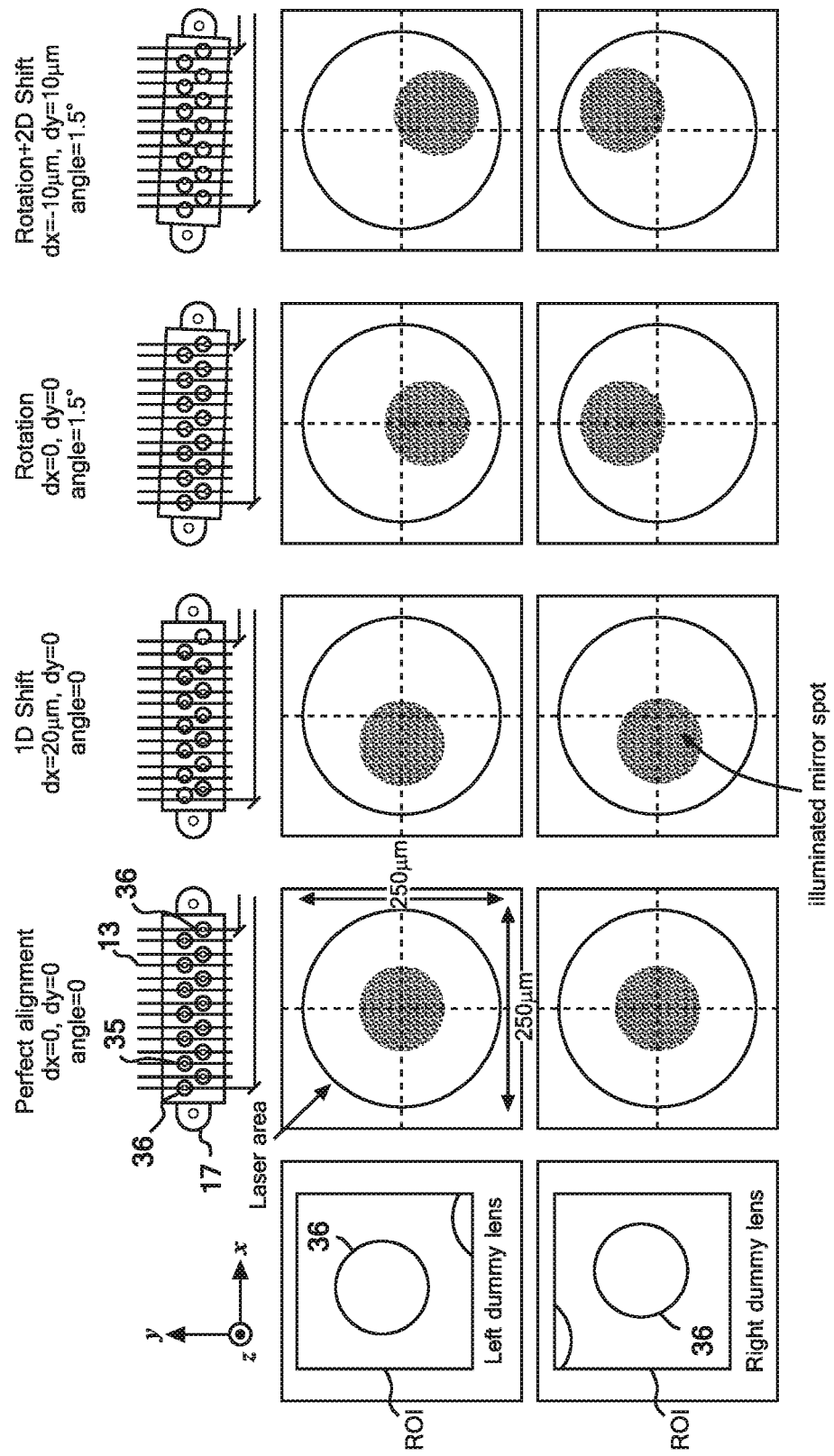
FIG. 10 depicts examples of misalignments between the micro-lens connector and the waveguide substrate according to an alternative embodiment of the present invention.

Referring to FIG. 10, examples of misalignments between the micro-lens connector and the waveguide substrate according to an exemplary embodiment of the present invention is illustrated. As shown in FIG. 10, the micro-lens connectors may include an additional two micro-lenses 36, each of which are located at the left side and right side of the regular micro-lens array 35. The compensation process for an automatic inspection system is described as follows. First, inspection light is injected into dummy cores 21 to form illuminated spots on the dummy mirrors 21. The illuminated spots can be detected through dummy lenses 36 by the inspection camera. The characteristics values (such as centroid, intensity, etc.) of the illuminated spots are calculated and compared between both dummy lenses 36 to evaluate misalignments regarding displacement and rotation between the connector 17 and the regular micro-lens array 35 of the waveguide substrate. The values of displacements and rotations between micro-lens connector 17 and the mirror array of the waveguide substrate 15 can be estimated. By using these characteristics values, the connector 17 may be adjustably moved on the waveguide layer 15 to compensate misalignment between the connector 17 and the regular mirror array 19.

As shown in the figure, four cases of misalignments are illustrated; case 1 shows a perfect alignment (dx=0, dy=0, angle=0), case 2 shows a misalignment with 1D shift-displacement (dx=20 um, dy=0, angle=0), case 3 shows a misalignment with 1.5° rotation (dx=0, dy=0, angle=1.5°), case 4 shows a misalignment with a combination of displacement and rotation (dx=−10 um, dy=10 um, angle=1.5°). Especially in an automatic inspection system, the compensation procedures enables fine alignment in the mass-production misalignment between the micro-lens connector 17 and the waveguide substrate 15. Also with an automatic inspection system, the precision can go up to micrometer scale.

Figure 11:
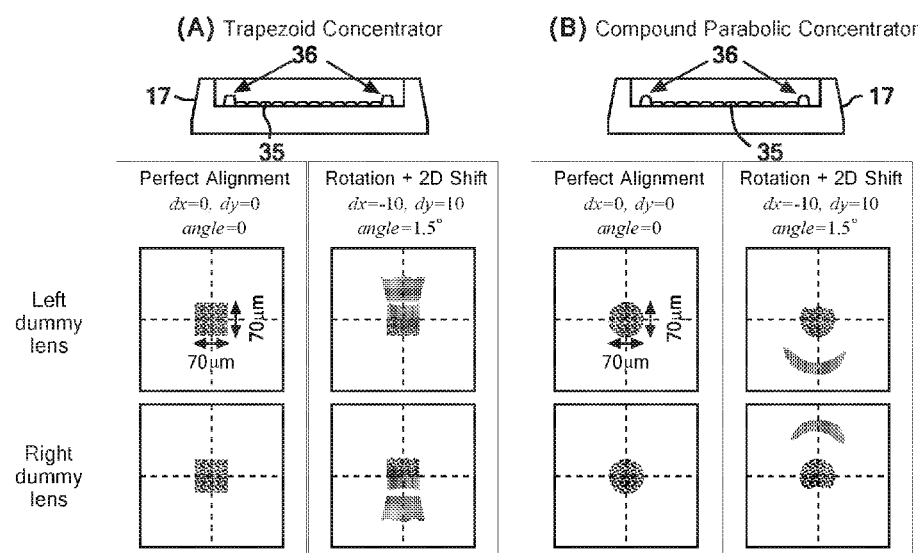
FIG. 11 depicts examples of two types of concentrators for a micro-lens connector according to an alternative exemplary embodiment of the present invention.

Referring to FIG. 11, examples of two types of concentrators for a micro-lens connector according to alternative exemplary embodiments of the present invention are illustrated. In (A) and (B) of the figure, two types of concentrator lenses are provided for dummy lens 36. As the dummy lens 36, a trapezoid lens and a compound parabolic lens may be applied to the connector 17, which are much different from regular micro-lens 35. Both sides of the dummy lens 36 have capabilities of enhancing misalignments more than regular micro-lens 35. These lenses have quadrangular and regional pyramid shape, of which curvature factor is large As shown in the figure, illuminated spots through the left dummy lens and the right dummy lens 36 enhance displacements and rotations more than the embodiment explained in FIG. 10. Therefore, the adaption of these micro-lenses to dummy lenses achieve fine alignment for Optical MCM assembly more than regular lens 35.

During the alignment process of the present invention, optoelectric components, such as VCSELs and PDs, may not be applicable to the waveguide substrate 15 during the micro-lens connector assembly process. The micro-lens connector assembly process belongs to the backend of the entire production flow later than the electric components (e.g., CPU, VCSEL, PD) bonding processes. It is dangerous to inject signal to power-on the CPU while bonding the micro-lens connector. Not only may the chips overheat (especially when no heat sink is attached), but merely the LGA (Land Grid Array) pads and socket underneath could be destroyed when putting force on the module. In addition, extra sockets and signal injection systems are required.

The alignment mechanism explained referring to FIGS. 3 to 11 may be applicable to multiple Optical MCMs connected together to form the optical communication system 1 of FIG. 1. Moreover, the alignment mechanism of the invention may be used for finely positioning one optical member on another optical member.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for manufacturing an optical interconnect structure, comprising:
    providing a lens array having at least one dummy lens;
    providing a waveguide substrate having at least one dummy core, at least one dummy mirror corresponding to the at least one dummy core, and at least one inspection opening to inject inspection light into the at least one dummy core to reach the at least one dummy mirror; and
    fixing the lens array on the waveguide substrate, wherein fixing includes aligning the at least one dummy lens with the at least one dummy mirror by monitoring the inspection light from the at least one inspection opening.

2. The method of claim 1, wherein fixing comprises:
    injecting the inspection light into the at least one dummy core from the at least one inspection opening;
    detecting intensity and position of each light spot illuminated on the at least one dummy mirror with an inspection camera; and
    adjustably moving the lens array on the waveguide substrate during monitoring of the light spot to shift the intensity and the position of the light spot to a centroid of the intensity and the position.

3. The method of claim 2, wherein fixing further comprises, before injecting the inspection light:
    capturing an image of the lens array with the inspection camera to identify a centroid position of the at least one dummy lens; and
    mounting the lens array on the waveguide substrate by referencing the image.

4. The method of claim 2, wherein the lens array includes two dummy lenses, and the waveguide substrate includes two dummy cores, and one or two inspection openings, wherein fixing further comprises:
    comparing the intensity and the position of two light spots on two dummy mirrors to evaluate a relative intensity and a relative position of the two light spots; and
    adjustably moving the lens array on the waveguide substrate during monitoring of the two light spots to minimize a difference of the relative intensity and the relative position between the two light spots.

5. The method of claim 1, wherein:
    the lens array further includes a plurality of regular micro-lenses for signal transfer, wherein the at least one dummy lens is aligned with a regular micro-lens; and
    the waveguide substrate further includes a plurality of regular cores and regular mirrors for signal transfer, the regular mirrors corresponding to the plurality of regular cores and the plurality of regular micro-lenses to turn an optical signal through the plurality of regular cores and to guide the inspection light to the regular micro-lens of the lens array, wherein the at least one dummy core is aligned with a regular core.

6. The method of claim 5, wherein:
    the lens array includes two dummy lenses positioned at outermost edge sides of the lens array to form a micro-lens connector; and
    the waveguide substrate includes two dummy cores patterned at outermost edge sides of the plurality of regular cores.

7. The method of claim 5, wherein the at least one dummy mirror has a reverse direction against a direction of the regular mirrors.

8. The method of claim 5, wherein the at least one dummy mirror has a same direction as a direction of the regular mirrors.

9. The method of claim 1, wherein the at least one inspection opening is located on a side edge of the waveguide substrate, and the at least one inspection opening is connected with the at least one dummy core to inject the inspection light from outside to the side edge.

10. The method of claim 1, wherein the waveguide substrate further includes a forty-five degree out-of-plane mirror to inject the inspection light, wherein the at least one inspection opening is provided on a surface of the waveguide substrate through the forty-five degree out-of-plane mirror, and the at least one inspection opening is connected to the at least one dummy core to inject the inspection light from outside to the surface of the waveguide substrate.

11. The method of claim 1, wherein the waveguide substrate further includes a forty-five degree in-plane mirror, wherein the at least one dummy core extends via the forty-five degree in-plane mirror.

12. The method of the claim 5, wherein the waveguide substrate further comprises optoelectronic components bonded on each of the plurality of regular cores to transfer optical signals from/to each of the optoelectronic components.

\* \* \* \* \*